United States Patent
Utsugi et al.

(10) Patent No.: US 10,256,350 B2
(45) Date of Patent: Apr. 9, 2019

(54) METHOD OF MANUFACTURING THIN FILM TRANSISTOR AND THIN FILM TRANSISTOR

(71) Applicant: Sakai Display Products Corporation, Osaka (JP)

(72) Inventors: Satoru Utsugi, Osaka (JP); Shigeru Ishida, Osaka (JP); Ryouhei Takakura, Osaka (JP); Yoshiaki Matsushima, Osaka (JP); Nobutake Nodera, Osaka (JP); Takao Matsumoto, Osaka (JP)

(73) Assignee: Sakai Display Products Corporation (JP)

( * ) Notice: Subject to any disclaimer, the term of this patent is extended or adjusted under 35 U.S.C. 154(b) by 0 days.

(21) Appl. No.: 15/923,546

(22) Filed: Mar. 16, 2018

(65) Prior Publication Data
US 2018/0204957 A1 Jul. 19, 2018

Related U.S. Application Data

(63) Continuation-in-part of application No. PCT/JP2015/076705, filed on Sep. 18, 2015.

(51) Int. Cl.
*H01L 29/786* (2006.01)
*H01L 21/02* (2006.01)
(Continued)

(52) U.S. Cl.
CPC .... *H01L 29/78696* (2013.01); *H01L 21/0274* (2013.01); *H01L 21/02532* (2013.01);
(Continued)

(58) Field of Classification Search
CPC .......... H01L 29/78696; H01L 29/7866; H01L 29/66765; H01L 21/02675;
(Continued)

(56) References Cited

U.S. PATENT DOCUMENTS

2012/0138942 A1 6/2012 Segawa

FOREIGN PATENT DOCUMENTS

| EP | 0473988 A1 | 3/1992 |
|----|------------|--------|
| JP | H06342909 A | 12/1994 |

(Continued)

*Primary Examiner* — Anthony Ho
(74) *Attorney, Agent, or Firm* — St. Onge Steward Johnston & Reens, LLC

(57) ABSTRACT

A method of manufacturing a thin film transistor including: forming a gate electrode on a substrate, forming an insulating film, forming a first silicon layer including an amorphous silicon, irradiating a region of the first silicon layer from a part or the whole of a predetermined region of the first silicon layer to an outside of the predetermined region with an energy beam so as to convert a portion of the first silicon layer into a polycrystalline silicon, a first etching step for etching the first silicon layer while leaving the predetermined region, forming a second silicon layer including an amorphous silicon so as to cover the predetermined region, a second etching step for etching the second silicon layer covering the predetermined region while leaving a part of the second silicon layer, the part larger than the predetermined region, and forming a source electrode and a drain electrode.

4 Claims, 14 Drawing Sheets

(51) Int. Cl.
　　　*H01L 21/027*　　(2006.01)
　　　*H01L 21/306*　　(2006.01)
　　　*H01L 29/66*　　(2006.01)

(52) U.S. Cl.
　　　CPC .. *H01L 21/02592* (2013.01); *H01L 21/02675* (2013.01); *H01L 21/30604* (2013.01); *H01L 29/66765* (2013.01); *H01L 29/786* (2013.01); *H01L 29/7866* (2013.01)

(58) Field of Classification Search
　　　CPC ......... H01L 21/30604; H01L 21/02592; H01L 21/02532; H01L 21/0274; H01L 29/786
　　　See application file for complete search history.

(56)　　　　　　　References Cited

FOREIGN PATENT DOCUMENTS

| | | |
|---|---|---|
| JP | 2008140984 A | 6/2008 |
| JP | 2011029411 A | 2/2011 |
| JP | 2012114131 A | 6/2012 |
| WO | 2011161910 A1 | 12/2011 |

METHOD OF MANUFACTURING THIN FILM TRANSISTOR AND THIN FILM TRANSISTOR

CROSS-REFERENCE TO RELATED APPLICATION

This is a continuation-in-part of PCT international application No. PCT/JP2015/076705 filed on Sep. 18, 2015, incorporated herein by reference.

BACKGROUND OF THE INVENTION

The present disclosure relates to a thin film transistor, and a method of manufacturing the thin film transistor.

Thin film transistor (TFT) is often used in a liquid crystal display panel as an active element for driving a pixel electrode for displaying pixels. TFTs include TFTs using an amorphous silicon as a semiconductor material and TFTs using a polycrystalline silicon as a semiconductor material. The mobility in a polycrystalline silicon is higher than in an amorphous silicon. Therefore, the TFT formed using a polycrystalline silicon can operate faster. On the contrary, since the mobility in an amorphous silicon is lower than in a polycrystalline silicon, the TFT formed using an amorphous silicon can reduce off-state leakage current.

JP 2012-114131 A discloses a TFT using properties of both of an amorphous silicon and a polycrystalline silicon. This TFT includes a gate electrode formed on an insulating substrate; an insulating layer formed to cover the substrate and the gate electrode; a polycrystalline silicon layer formed on the insulating layer; an amorphous silicon layer formed on the polycrystalline silicon layer; and a source electrode and a drain electrode formed on the amorphous silicon layer. The polycrystalline silicon layer is formed by forming an amorphous silicon layer and then treating the amorphous silicon layer with laser radiation to convert the amorphous silicon into the polycrystalline silicon. The polycrystalline silicon layer and the amorphous silicon layer serve as a channel layer. The TFT has an intermediate property such as mobility between the property of the channel layer formed by polycrystalline silicon layer and the property of the channel layer formed by amorphous silicon layer.

Further, there are technologies being developed in which a part of the amorphous silicon layer is converted into the polycrystalline silicon by treating a part of the amorphous silicon layer with laser radiation, instead of converting the entire amorphous silicon layer into a polycrystalline silicon. Properties of a TFT can be properly adjusted by controlling an amount of the amorphous silicon to be converted into the polycrystalline silicon layer.

SUMMARY OF THE INVENTION

In the technology in which a part of the amorphous silicon layer is converted into a polycrystalline silicon by laser radiation, a position for laser radiation can vary. It causes variations in positions the polycrystalline silicon is generated in the amorphous silicon layer, resulting in the variations in properties of a TFT such as a mobility and a leakage current. Possible causes of the property change include a change of an area of a portion where a region of a substrate to which the polycrystalline silicon is projected and a region of a substrate to which a source electrode and a drain electrode are projected overlap each other, which leads a change of a parasitic capacitance. Further, it can be explained by a change of an area and a shape of a portion where a region of a substrate to which the polycrystalline silicon is projected and a region of a substrate to which a source electrode and a drain electrode are projected on a substrate overlap each other, which leads a change of the respective electric potential of each electrode and a change of the mobility.

The present invention is made in view of such circumstances as mentioned above, and an object of the present invention is to provide a method of manufacturing a thin film transistor and to provide the thin film transistor, in which the variations in properties can be decreased by decreasing variations in positions of the polycrystalline silicon in a channel layer.

A method of manufacturing a thin film transistor according to the present disclosure comprises forming a gate electrode on a surface of a substrate, forming an insulating film on the surface of the substrate on which the gate electrode is formed, forming a first silicon layer comprising an amorphous silicon after formation of the insulating film, irradiating a region of the first silicon layer from a part or the whole of a predetermined region of the first silicon layer to an outside of the predetermined region with an energy beam so as to convert a portion of the first silicon layer irradiated with the energy beam into a polycrystalline silicon, a first etching step for etching the first silicon layer while leaving the predetermined region, forming a second silicon layer comprising an amorphous silicon in a region larger than the predetermined region of the first silicon layer so as to cover the predetermined region of the first silicon layer, a second etching step for etching the second silicon layer covering the predetermined region of the first silicon layer while leaving a part of the second silicon layer, the part larger than the predetermined region of the first silicon layer, and forming a source electrode and a drain electrode such that the first silicon layer and the second silicon layer after being etched serve as channel layers.

In the method of manufacturing a thin film transistor according to the present disclosure, it is preferable that the source electrode and the drain electrode are formed in such a way that a region of a substrate to which a polycrystalline silicon portion in the first silicon layer is projected and a region of the substrate to which at least one of the source electrode and the drain electrode are projected overlap each other.

In the method of manufacturing a thin film transistor according to the present disclosure, it is preferable that the first etching step comprises forming a first photoresist to protect the predetermined region of the first silicon layer and a part of the first silicon layer adjacent to the predetermined region using a multi-gradation photomask, wherein a thickness of a portion of the first photoresist to protect the part adjacent to the predetermined region is thinner than a thickness of a portion of the first photoresist to protect the predetermined region, removing the portion of the first photoresist to protect the part adjacent to the predetermined region by an ashing, and removing a portion of the first silicon layer not protected by a remaining portion of the first photoresist, and the second etching step comprises forming a second photoresist to protect a portion of the second silicon layer covering the predetermined region of the first silicon layer and a part of the second silicon layer adjacent thereto by using the same photomask as used in the first etching step, and removing a portion of the second silicon layer not protected by the second photoresist.

In the method of manufacturing a thin film transistor according to the present disclosure, it is preferable that the first etching step and the second etching step comprise forming a respective photoresist by using the same photomask in the first etching step and the second etching step, and different etching conditions are used in the first etching step and the second etching step such that an area of the second silicon layer after the second etching is larger than an area of the first silicon layer after the first etching step.

A thin film transistor according to the present disclosure comprises a substrate, a gate electrode arranged on a surface of the substrate, a first silicon layer arranged above the gate electrode, a second silicon layer arranged above the first silicon layer, and a source electrode and a drain electrode, a part of the source electrode and a part of the drain electrode arranged above the second silicon layer, wherein a part or the whole of the first silicon layer is made of a polycrystalline silicon generated by an irradiation of an amorphous silicon with an energy beam, and the second silicon layer is made of an amorphous silicon, covers a surface and sides of the first silicon layer, and is arranged in a region larger than the first silicon layer.

In the thin film transistor according to the present disclosure, it is preferable that a region of the substrate to which a polycrystalline silicon portion in the first silicon layer is projected and a region of the substrate to which at least one of the source electrode and the drain electrode are projected overlap each other.

In the present disclosure, variations in positions of the polycrystalline silicon in a channel layer of the TFT can be reduced. Accordingly, variations in properties of the TFT can be reduced. Therefore, the present disclosure can provide an excellent effect, for example, the properties of the TFT can be adjusted accurately.

DETAILED DESCRIPTION

The present disclosure will be further described below in terms of drawings showing Embodiments of the present disclosure.

Embodiment 1

Figure 1:
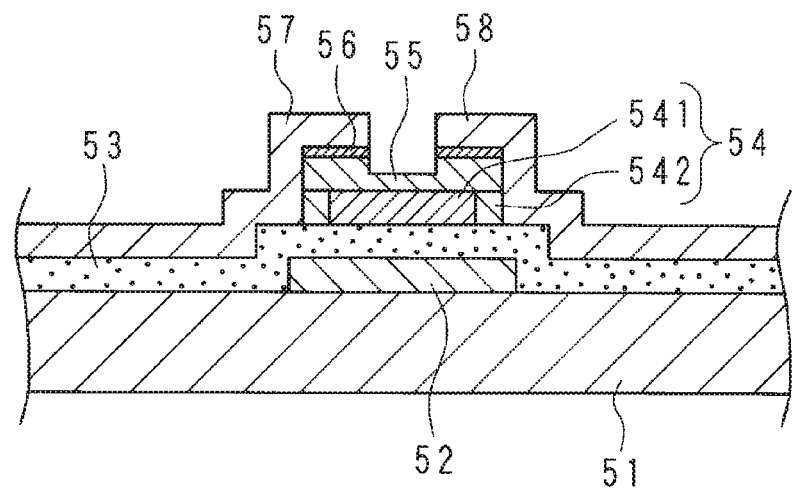
FIG. 1 shows a cross-sectional view schematically showing principal parts of a conventional TFT.

First, a conventional TFT and a conventional method of manufacturing a TFT are described. FIG. 1 shows a cross-sectional view schematically showing principal parts of a conventional TFT. A gate electrode 52 is formed on a surface of an insulating substrate 51 such as a glass substrate, and a gate insulating film 53 is formed on the substrate 51 so as to cover the gate electrode 52. A first semiconductor layer 54 is formed on the surface of the gate insulating film 53 above the gate electrode 52. The first semiconductor layer 54 includes a polycrystalline silicon portion 541 comprising a polycrystalline silicon and an amorphous silicon portion 542 comprising an amorphous silicon. The amorphous silicon portion 542 is disposed around the polycrystalline silicon portion 541. A second semiconductor layer 55 made of an amorphous silicon is formed on the surface of the first semiconductor layer 54.

An n+Si layer 56 is formed at a predetermined position on the surface of the second semiconductor layer 55. The n+Si layer 56 is made of n-type silicon comprising an impurity. A source electrode 57 and a drain electrode 58 which have a required pattern are formed on the surface of the n+Si layer 56, on the sides of the first semiconductor layer 54 and the second semiconductor layer 55, and on the surface of the gate insulating film 53. The n+Si layer 56 is a contact layer of the source electrode 57 and the drain electrode 58. The first semiconductor layer 54 and the second semiconductor layer 55 are channel layers.

Figure 2:
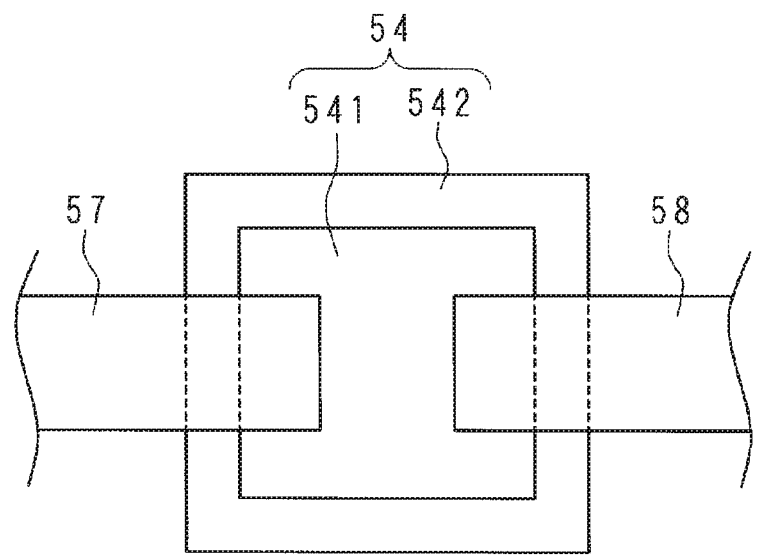
FIG. 2 shows a schematic plan view showing principal parts of a conventional TFT.

FIG. 2 shows a schematic plan view showing principal parts of a conventional TFT. FIG. 2 shows a positional relationship of the first semiconductor layer 54, the source electrode 57 and the drain electrode 58 in a plan view, and other structures of the TFT are omitted. The polycrystalline silicon portion 541 is formed in a rectangular shape in a plan view, and the amorphous silicon portion 542 is formed to surround a periphery of the polycrystalline silicon portion 541. As shown in FIG. 2, the regions of a surface of the substrate 51 to which a part of the source electrode 57 and a part of the polycrystalline silicon portion 541 are respectively projected are overlapped, and similarly, the regions of a surface of the substrate 51 to which a part of the drain electrode 58 and a part of the polycrystalline silicon portion 541 are respectively projected are overlapped.

Figure 3:
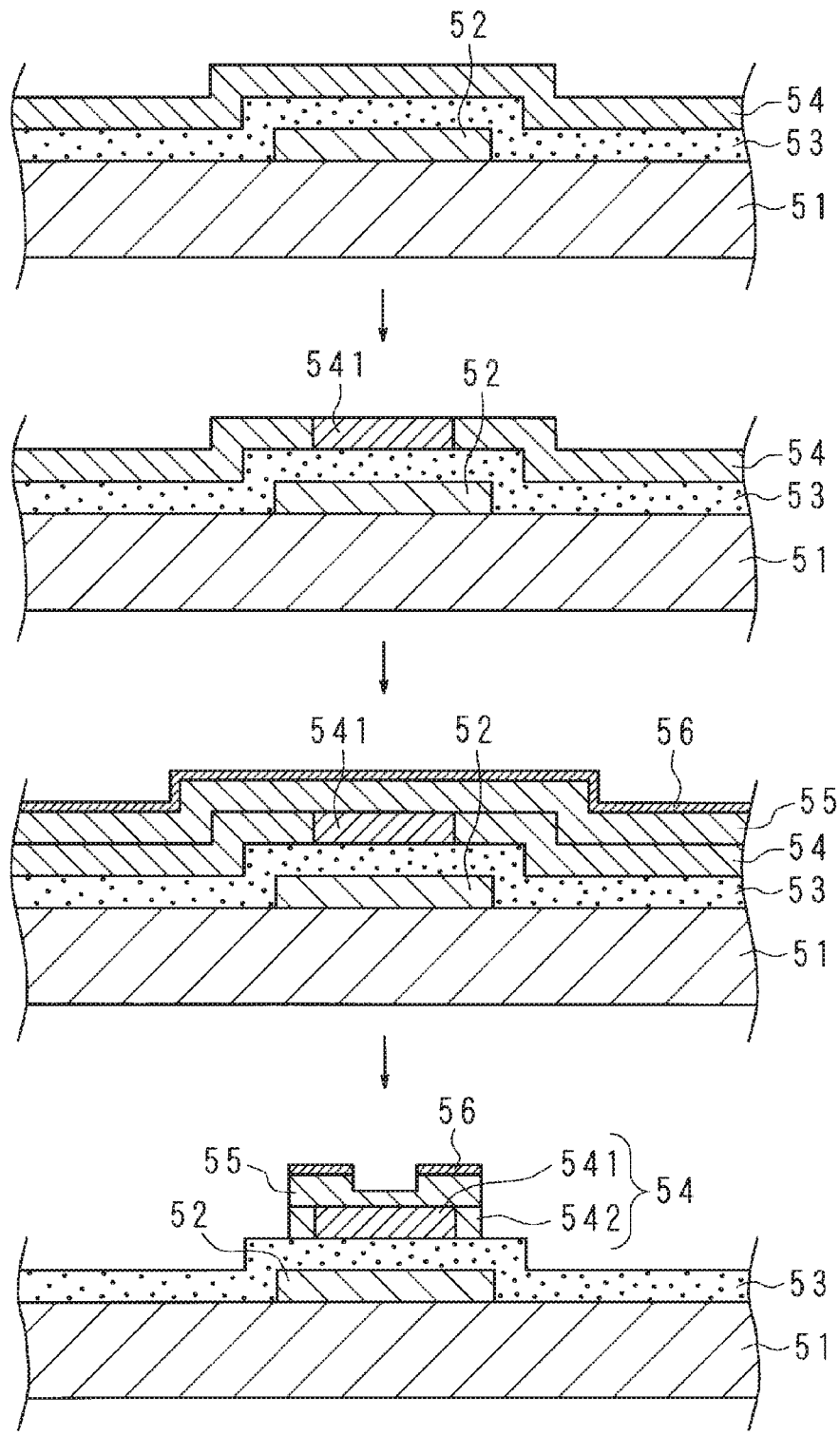
FIG. 3 shows a cross-sectional view schematically showing a manufacturing method of a conventional TFT.

FIG. 3 shows a cross-sectional view schematically showing a manufacturing method of a conventional TFT. As shown in the first figure of FIG. 3, the gate electrode 52 is formed on the substrate 51, the gate insulating film 53 is formed on the substrate 51 so as to cover the gate electrode 52, and the first semiconductor layer 54 is formed on the surface of the gate insulating film 53. At this step, the entire first semiconductor layer 54 is the amorphous silicon portion 542. Next, as shown in the second figure of FIG. 3, a part of the first semiconductor layer 54 is converted into the polycrystalline silicon portion 541. In this step, the first semiconductor layer 54 is irradiated with a laser beam, so that a temperature of silicon is increased by heat of the laser beam, and by stopping of the laser beam irradiation the silicon releases heat and an annealing process is performed. By the annealing treatment, the amorphous silicon is converted into the polycrystalline silicon at the portion irradiated with the laser beam, and the polycrystalline silicon portion 541 is generated. The portion which is not irradiated with a laser beam is the amorphous silicon portion 542. Next, as shown in the third figure of FIG. 3, the second semiconductor layer 55 is formed to cover the first semiconductor layer 54, and the n+Si layer 56 is formed on the second semiconductor layer 55. Subsequently, as shown in the fourth figure of FIG. 3, a required pattern is formed on the n+Si layer 56, and then, the first semiconductor layer 54, the second semiconductor layer 55 and the n+Si layer 56 are etched in accordance with the formed pattern. Then, as shown in FIG. 1, the source electrode 57 and the drain electrode 58 are formed on the etched n+Si layer 56.

The polycrystalline silicon portion 541 is formed at a position of the first semiconductor layer 54 irradiated with a laser beam. Variations in positions which are irradiated with the laser beam occur, so that variations in positions of the polycrystalline silicon portion 541 will also occur. Therefore, in a conventional TFT, there occur variations in areas and shapes of a portion where a region of the substrate 51 to which the polycrystalline silicon portion 541 is projected and a region of the substrate 51 to which the source electrode 57 and the drain electrode 58 are respectively projected overlap each other, and as a result, variations in properties of the TFT occur.

Figure 4:
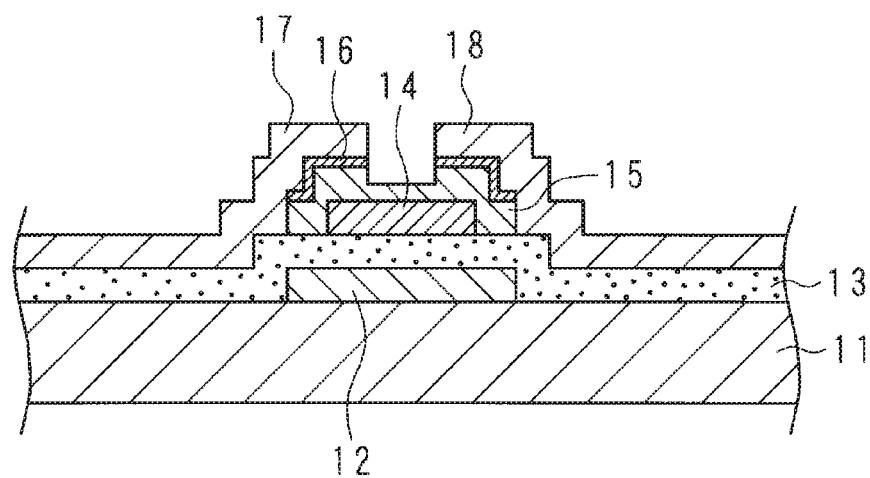
FIG. 4 shows a cross-sectional view schematically showing principal parts of a TFT according to Embodiment 1.

A TFT according to the presently illustrated embodiment will be described below. FIG. 4 shows a cross-sectional view schematically showing principal parts of a TFT according to Embodiment 1. A gate electrode 12 is formed on a surface of an insulating substrate 11 such as a glass substrate, and a gate insulating film 13 is formed on the substrate 11 so as to cover a surface of the gate electrode 12. The gate insulating film 13 is, for example, a silicon nitride layer. A first silicon layer 14 is formed on the surface of the gate insulating film 13 above the gate electrode 12. The first silicon layer 14 is made of a polycrystalline silicon. Further, a second silicon layer 15 is formed so as to cover the first silicon layer 14. The second silicon layer 15 is made of an amorphous silicon. The second silicon layer 15 covers not only the first silicon layer 14 but also a part of the gate insulating film 13 arranged at a periphery of the first silicon layer 14. Accordingly, the second silicon layer 15 covers the surface and sides of the first silicon layer 14.

An n+Si layer 16 is formed at a predetermined position on the surface of the second silicon layer 15. The n+Si layer 16 is made of n-type silicon having a high concentration of impurity such as phosphorus or arsenic. A source electrode 17 and a drain electrode 18 which have a required pattern are formed on the surface of the n+Si layer 16, on the sides of the second silicon layer 15, and on the surface of the gate insulating film 13. The n+Si layer 16 is a contact layer of the source electrode 17 and the drain electrode 18. The first silicon layer 14 and the second silicon layer 15 are channel layers.

Figure 5:
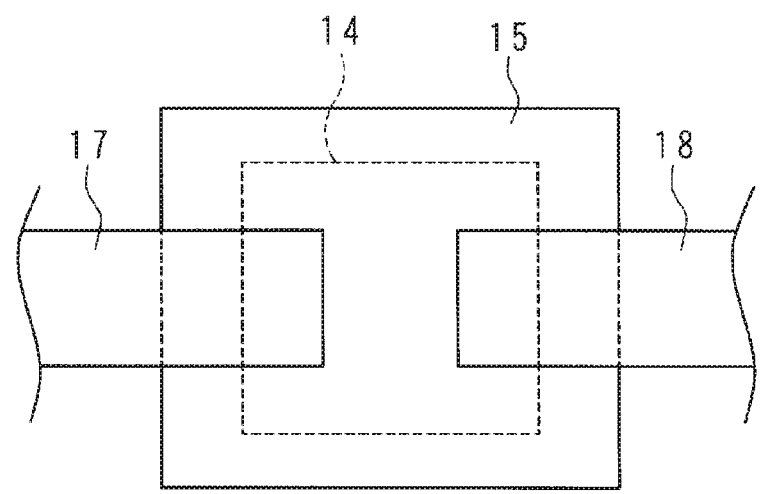
FIG. 5 shows a schematic plan view showing principal parts of a TFT according to Embodiment 1.

FIG. 5 shows a plan view schematically showing principal parts of a TFT according to Embodiment 1. FIG. 5 shows a positional relationship of the first silicon layer 14, the second silicon layer 15, the source electrode 17 and the drain electrode 18 in a plan view, and other structures of the TFT are omitted. The first silicon layer 14 is formed in a rectangular shape in a plan view and covered with the second silicon layer 15. In FIG. 5, the first silicon layer 14 covered with the second silicon layer 15 is shown by a broken line. As shown in FIG. 5, the regions of a surface of the substrate 11 to which a part of the source electrode 17 and a part of the first silicon layer 14 are respectively projected are overlapped, and similarly, the regions of a surface of the substrate 11 to which a part of the drain electrode 18 and a part of the first silicon layer 14 are respectively projected are overlapped. Mobility is increased by the first silicon layer 14 made of a polycrystalline silicon, while leakage current is reduced by the second silicon layer 15 made of an amorphous silicon.

Figure 6:
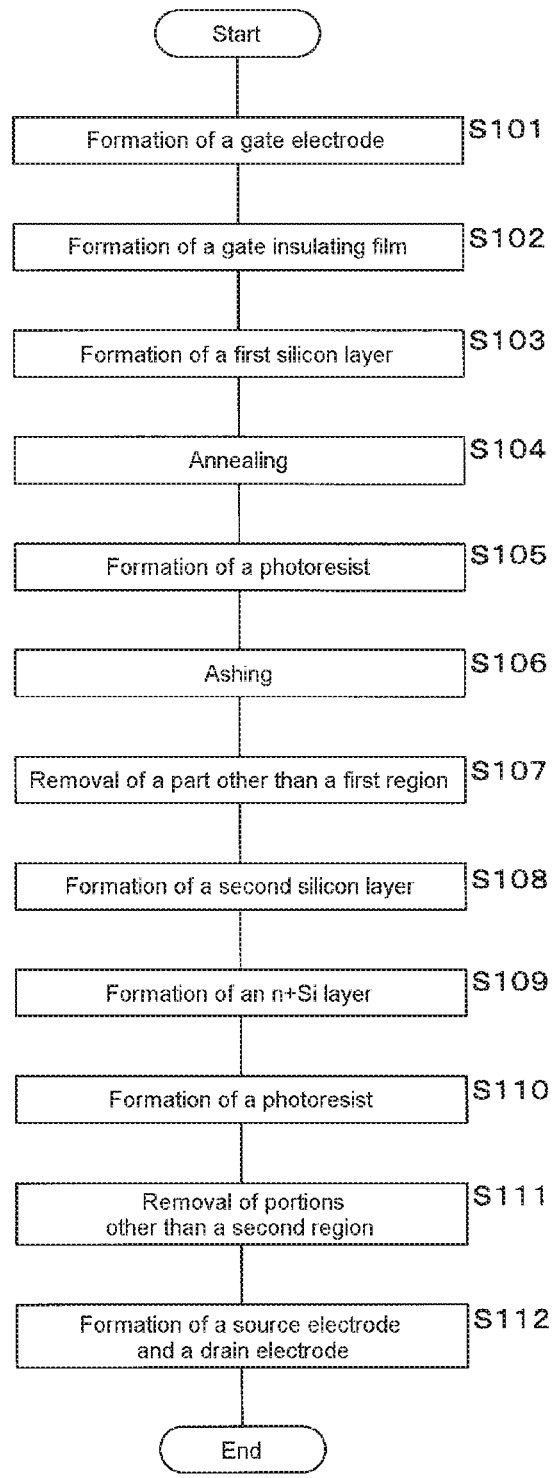
FIG. 6 shows a flow chart showing a manufacturing method of a TFT according to Embodiment 1.
Figure 7A:
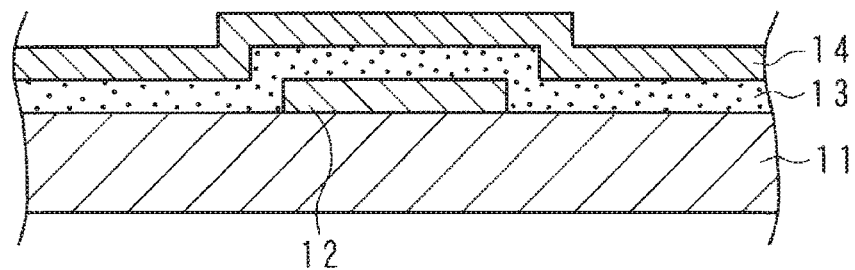
FIG. 7A shows a schematic cross-sectional view showing a part of a manufacturing process of a TFT according to Embodiment 1.

FIG. 6 shows a flow chart showing a manufacturing method of a TFT according to Embodiment 1. FIG. 7A to FIG. 7H show schematic cross-sectional views showing a part of a manufacturing process of a TFT according to Embodiment 1. FIG. 8A to FIG. 8F show schematic plan views showing a part of a manufacturing process of a TFT according to Embodiment 1. As shown in FIG. 7A, the gate electrode 12 is formed on the substrate 11 (S101), the gate insulating film 13 is formed on the substrate 11 so as to cover the gate electrode 12 (S102), and the first silicon layer 14 made of an amorphous silicon is formed on the surface of the gate insulating film 13 (S103).

Figure 7B:
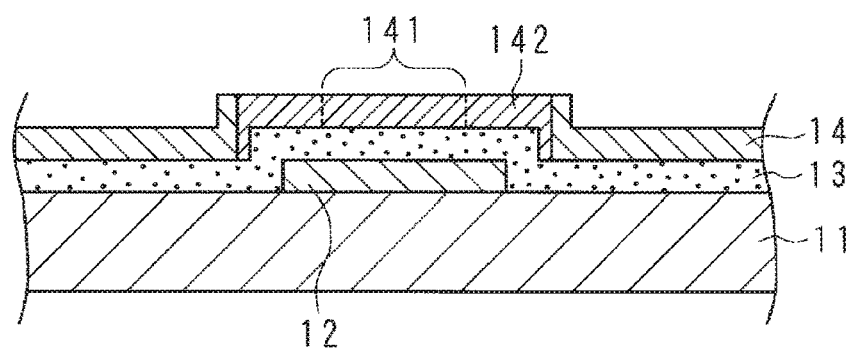
FIG. 7B shows a schematic cross-sectional view showing a part of a manufacturing process of a TFT according to Embodiment 1.
Figure 8A:
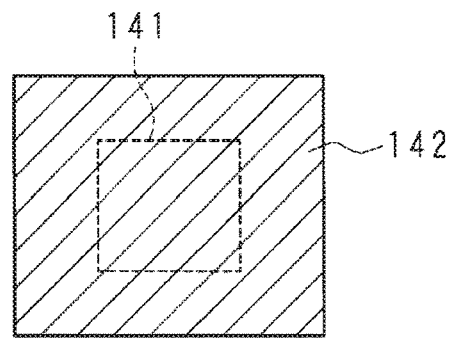
FIG. 8A shows a schematic plan view showing a part of a manufacturing process of a TFT according to Embodiment 1.

Subsequently, a part of the first silicon layer 14 is converted into a polycrystalline silicon by an annealing treatment (S104). During the annealing treatment in S104, a part of the first silicon layer 14 is irradiated with a laser beam (energy beam), so that a temperature of silicon is increased by heat of the laser beam, and by stopping of the laser beam irradiation, the silicon releases heat. By the annealing treatment, the amorphous silicon is converted into the polycrystalline silicon at the portion irradiated with the laser beam. FIG. 7B and FIG. 8A show a state in which a part of the first silicon layer 14 has been converted into the polycrystalline silicon. Within the formed first silicon layer 14, a region to be a component of the completed TFT forms a first region 141. The first region 141 is disposed above the gate electrode 12 and has a predetermined area. In FIG. 7B and FIG. 8A, the first region 141 is shown by a broken line. For example, a shape of a region of the substrate 11 to which the first region 141 is projected is a rectangle.

During the annealing treatment in S104, the laser beam is irradiated to a region of the first silicon layer 14, which includes the first region 141 and is larger than the first region 141. Namely, a region of the first silicon layer 14 from the inside of the first region 141 to the outside of the first region 141 is irradiated with the laser beam. For example, the laser beam is irradiated to a required region of the first silicon layer 14 including the first region 141 using a multi-lens array. For example, excimer laser which produces ultraviolet light that is strongly absorbed in an amorphous silicon can be used as a laser beam. At the portion of the first silicon layer 14 to which the laser beam is irradiated, the amorphous silicon is converted into the polycrystalline silicon, forming polycrystalline silicon portion 142. As shown in FIG. 7B and FIG. 8A, the first region 141 is the polycrystalline silicon portion 142, and a part adjacent to the first region 141 is also the polycrystalline silicon portion 142.

Figure 7C:
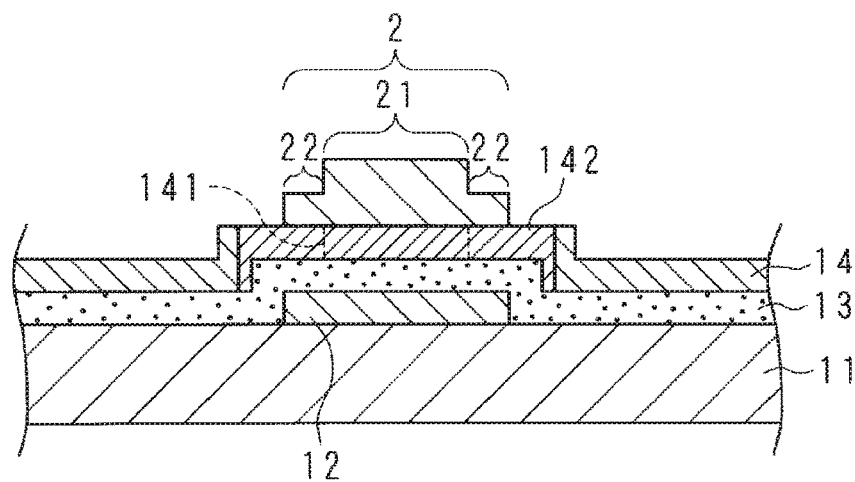
FIG. 7C shows a schematic cross-sectional view showing a part of a manufacturing process of a TFT according to Embodiment 1.
Figure 8B:
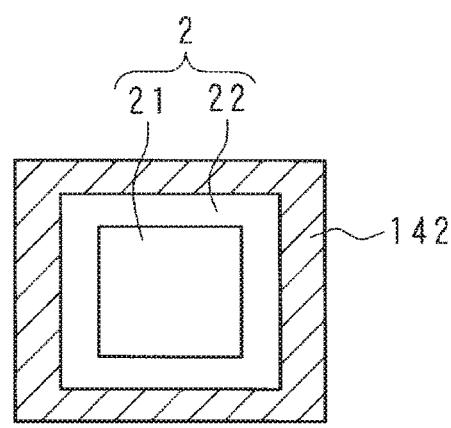
FIG. 8B shows a schematic plan view showing a part of a manufacturing process of a TFT according to Embodiment 1.

Next, a photoresist 2 to protect a required portion of the first silicon layer 14 is formed by photolithography (S105). FIG. 7C and FIG. 8B show a state in which the photoresist 2 has been formed. In the step S105, the photoresist 2 having two different thicknesses is formed by using a half-tone photomask. As shown in FIG. 7C, the photoresist 2 is formed at a position so as to protect the first region 141 and the part adjacent to the first region 141. The photoresist 2 comprises a central portion 21 to protect the first region 141 and a peripheral portion 22 to protect the part adjacent to the first region 141. The thickness of the peripheral portion 22 is thinner than that of the central portion 21.

Figure 7D:
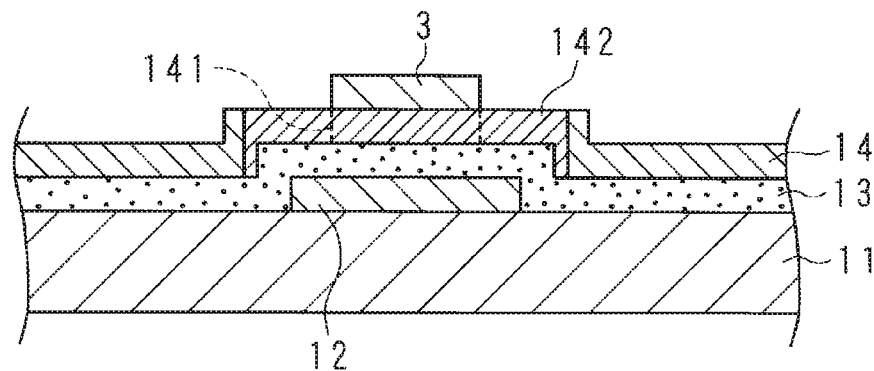
FIG. 7D shows a schematic cross-sectional view showing a part of a manufacturing process of a TFT according to Embodiment 1.
Figure 7E:
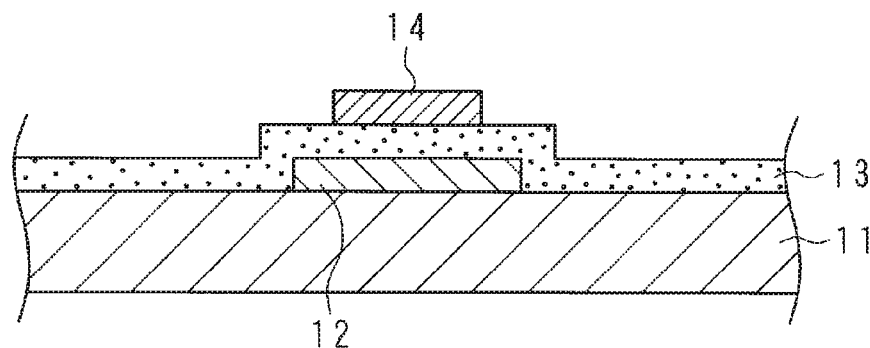
FIG. 7E shows a schematic cross-sectional view showing a part of a manufacturing process of a TFT according to Embodiment 1.
Figure 8C:
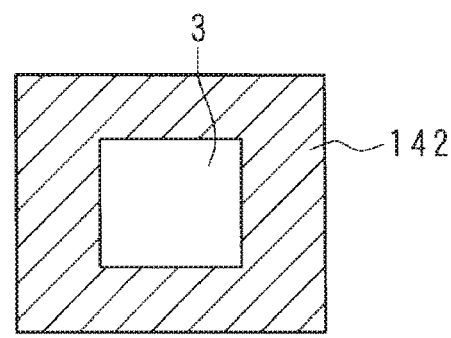
FIG. 8C shows a schematic plan view showing a part of a manufacturing process of a TFT according to Embodiment 1.
Figure 8D:
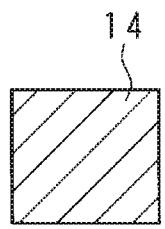
FIG. 8D shows a schematic plan view showing a part of a manufacturing process of a TFT according to Embodiment 1.

Next, ashing is carried out to remove the peripheral portion 22 from the photoresist 2 (S106). In the step S106, ashing conditions are controlled so that the comparatively thinner peripheral portion 22 of the photoresist 2 is removed, and the comparatively thick central portion 21 remains. FIG. 7D and FIG. 8C show a state after the ashing. By the ashing process, a photoresist 3 protecting the first region 141 of the first silicon layer 14 is formed. Next, a part of the first silicon layer 14 is removed other than the first region 141, which is protected by the photoresist 3, by wet etching or dry etching (S107). The steps from S105 to S107 correspond to the first etching step. After the first etching, the photoresist 3 is removed and cleaning is carried out. FIG. 7E and FIG. 8D show a state after the first etching. On the gate insulating film 13, a portion of the first silicon layer 14 to form a component of the TFT remains. The remaining first silicon layer 14 is made of polycrystalline silicon.

Figure 7F:
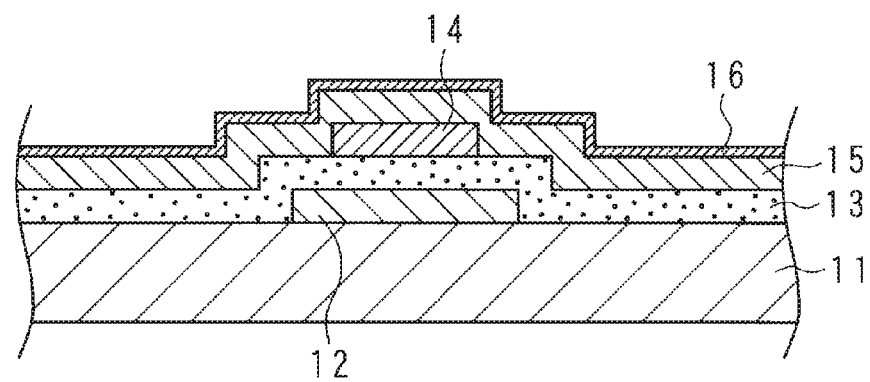
FIG. 7F shows a schematic cross-sectional view showing a part of a manufacturing process of a TFT according to Embodiment 1.

Next, a second silicon layer 15 made of an amorphous silicon is formed to cover the first silicon layer 14 (S108). In the step S108, the second silicon layer 15 is formed in a region larger than the first silicon layer 14. Next, an n+Si layer 16 is formed on the surface of the second silicon layer 15 (S109). FIG. 7F shows a state in which the n+Si layer 16 has been formed. The second silicon layer 15 and the n+Si layer 16 cover the first silicon layer 14.

Figure 7G:
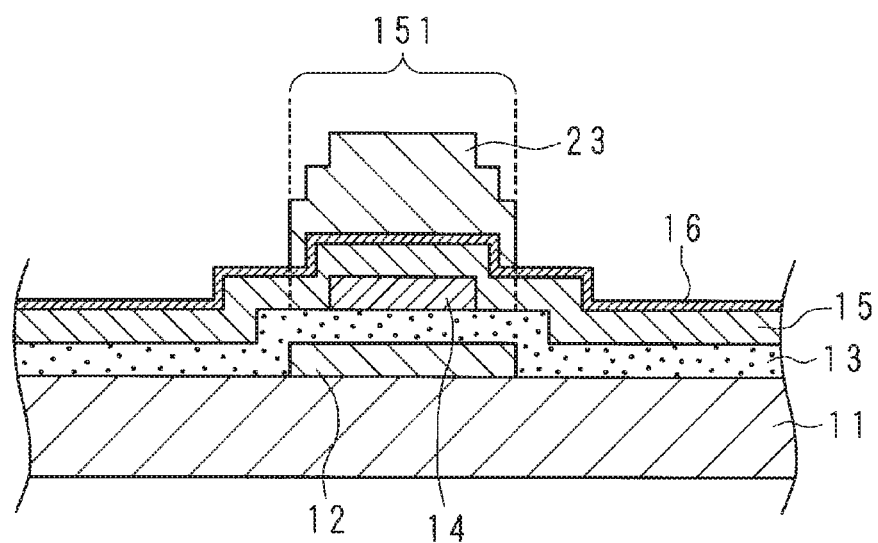
FIG. 7G shows a schematic cross-sectional view showing a part of a manufacturing process of a TFT according to Embodiment 1.
Figure 8E:
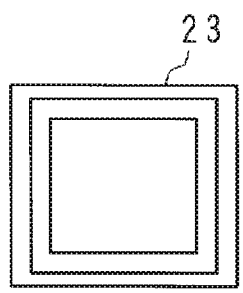
FIG. 8E shows a schematic plan view showing a part of a manufacturing process of a TFT according to Embodiment 1.

Next, a photoresist 23 to protect a required portion of the second silicon layer 15 and the n+Si layer 16 is formed by photolithography (S110). FIG. 7G and FIG. 8E show a state in which the photoresist 23 has been formed. In the step S110, the photoresist 23 is formed at the same position where the photoresist 2 was arranged by using the same photomask as used in the step S105. Using the same photomask as used in the step S105 enables to reuse the alignment mark which is used in the step S105. The photoresist 23 protects a portion of the second silicon layer 15 and n+Si layer 16 which covers the first silicon layer 14 and a part adjacent thereto. A portion of the second silicon layer 15 and n+Si layer 16, which is protected by the photoresist 23, forms a second region 151. In FIG. 7G, the second region 151 is shown by a broken line. The second region 151 of the second silicon layer 15 is arranged above the gate electrode 12, and covers the first silicon layer 14. An area of a region of the substrate 11 to which the second region 151 of the second silicon layer 15 is projected is larger than that of the first silicon layer 14 (the first region 141). The second region 151 of the second silicon layer 15 is a region to form a component of the completed TFT.

Figure 7H:
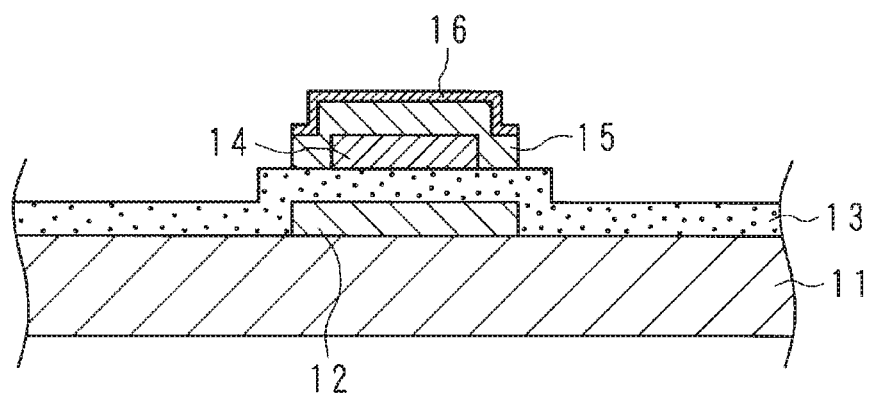
FIG. 7H shows a schematic cross-sectional view showing a part of a manufacturing process of a TFT according to Embodiment 1.
Figure 8F:
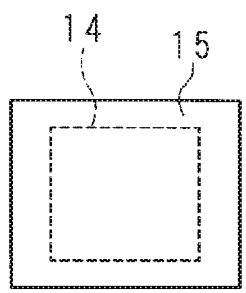
FIG. 8F shows a schematic plan view showing a part of a manufacturing process of a TFT according to Embodiment 1.

Next, portions of the second silicon layer 15 and the n+Si layer 16 are removed other than the second region 151, which is protected by the photoresist 23, by wet etching or dry etching (S111). The steps S110 and S111 correspond to the second etching step. After the second etching, the photoresist 23 is removed, and cleaning is carried out. FIG. 7H and FIG. 8F show a state after the second etching. The first silicon layer 14, the second silicon layer 15 to cover the first silicon layer 14 and also a part of the gate insulating film 13 arranged at a periphery of the first silicon layer 14, and the n+Si layer 16 to cover the second silicon layer 15 are formed above the gate insulating film 13. FIG. 8F shows a positional relationship in a plan view of the first silicon layer 14 and the second silicon layer 15, in which the n+Si layer 16 is omitted and the first silicon layer 14 is shown by a broken line.

Next, patterns of the source electrode 17 and the drain electrode 18 are formed on the n+Si layer 16 by photolithography, and portions of the n+Si layer 16 and the second silicon layer 15 arranged between the source electrode 17 and the drain electrode 18 are etched by using the formed patterns as a mask, providing the source electrode 17 and the drain electrode 18 shown in FIG. 4 (S112).

As described above in detail, in the presently illustrated embodiment, the first silicon layer 14 made of a polycrystalline silicon is formed by annealing treatment in which a region larger than the first region 141 of the first silicon layer 14, which is made of an amorphous silicon, is irradiated with a laser beam and by removing a part of the first silicon layer 14 other than the first region 141 using the etching. Since the first silicon layer 14 is formed by removing a part of the first silicon layer 14 other than a necessary part by the etching of a part of the laser beam irradiated portion of the first silicon layer 14, the position of the first silicon layer 14 made of a polycrystalline silicon is determined by the etching but not by the irradiation of the laser beam. This prevents variations in positions of the first silicon layer 14 resulting from the variations in irradiation positions of laser beam. Since one of the reasons which causes variations in positions of the first silicon layer 14 is eliminated, variations in positions of a polycrystalline silicon in a channel layer of a TFT can be decreased. Thus, variations in areas and shapes of a portion where a region of the substrate 11 to which the polycrystalline silicon in the channel layer (first silicon layer 14) is projected and a region of the substrate 11 to which the source electrode 17 and the drain electrode 18 is respectively projected overlap each other are decreased, decreasing variations in properties of the TFT such as mobility. Since variations in properties of the TFT such as mobility are decreased, properties of the TFT can be controlled accurately as compared with a conventional TFT by using the manufacturing method according to the presently illustrated embodiment.

In the presently illustrated embodiment, by using a half-tone photomask, the photoresist 3 to protect the first region 141 of the first silicon layer 14 and the photoresist 23 to protect the second region 151 of the second silicon layer 15 can be formed by using the same photomask. The number of photomasks to be required is not increased, suppressing an increase of a manufacturing cost. Further, using the same photomask enables to use the same alignment mark when forming the photoresist 3 to protect the first region 141 and the photoresist 23 to protect the second region 151. This can decrease variations in positions of the second silicon layer 15 with respect to the first silicon layer 14 in the TFT. It should be noted that in the presently illustrated embodiment, a photomask whose number of gradations is increased compared to the half-tone photomask may be used.

Further, in the conventional TFT shown in FIG. 1, an interface between the first semiconductor layer 54 and the second semiconductor layer 55 is arranged to connect between the source electrode 57 and the drain electrode 58, and thus the leakage current will flow through this interface. In the TFT according to the presently illustrated embodiment, as shown in FIG. 4, the second silicon layer 15 covers the surface and sides of the first silicon layer 14, and an interface between the first semiconductor layer 14 and the second semiconductor layer 15 is not arranged to connect between the source electrode 17 and the drain electrode 18. Therefore, the leakage current which flows through the interface between the first semiconductor layer 14 and the second semiconductor layer 15 is not generated. Thus, in the TFT according to the presently illustrated embodiment, the leakage current to be generated can be reduced.

Embodiment 2

Figure 9:
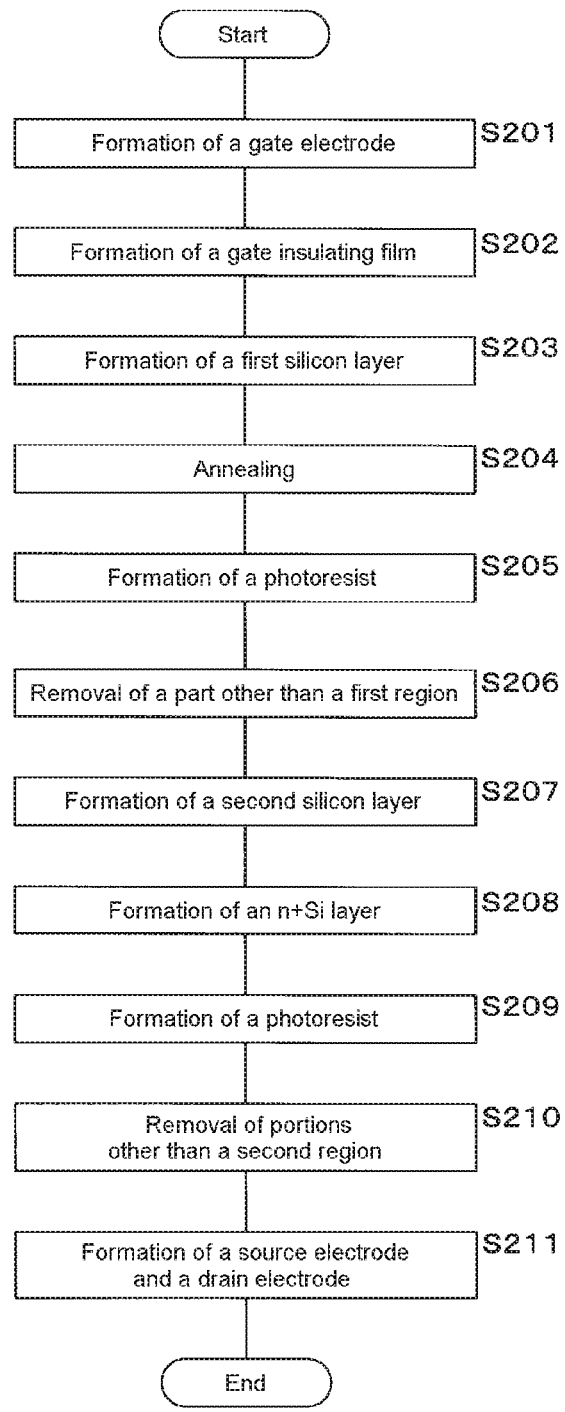
FIG. 9 shows a flow chart showing a manufacturing method of a TFT according to Embodiment 2.
Figure 10A:
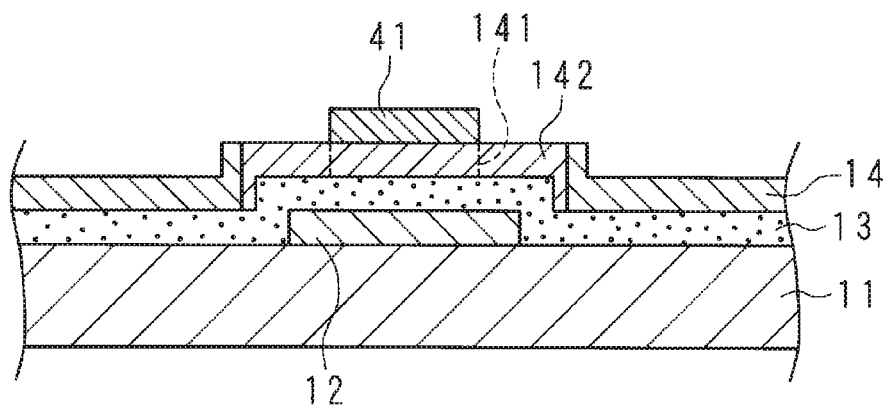
FIG. 10A shows a schematic cross-sectional view showing a part of a manufacturing process of a TFT according to Embodiment 2.
Figure 10B:
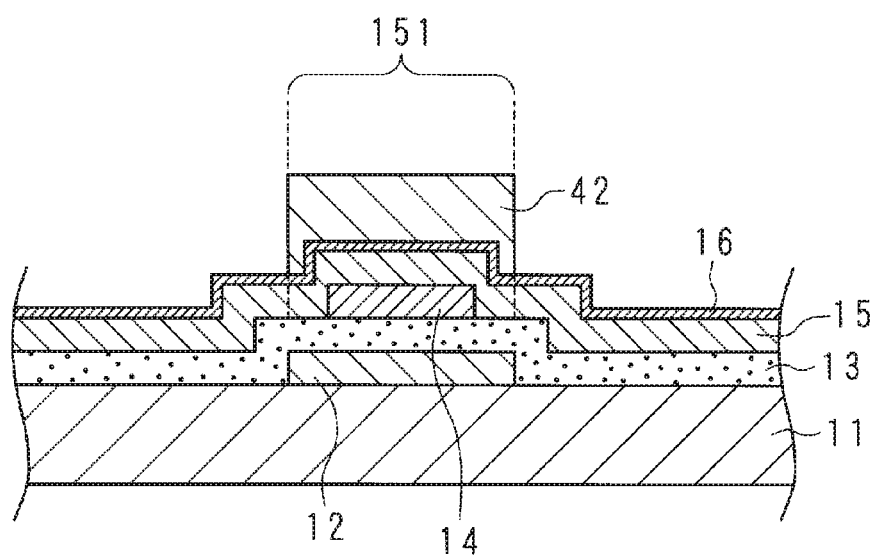
FIG. 10B shows a schematic cross-sectional view showing a part of a manufacturing process of a TFT according to Embodiment 2.

The structure of the TFT according to Embodiment 2 is similar to the TFT according to Embodiment 1. FIG. 9 shows a flow chart showing a manufacturing method of a TFT according to Embodiment 2. FIG. 10A and FIG. 10B show schematic cross-sectional views showing a part of a manufacturing process of a TFT according to Embodiment 2. As with Embodiment 1, as shown in FIG. 7A, the gate electrode 12 is formed on the substrate 11 (S201), the gate insulating film 13 is formed on the substrate 11 so as to cover the gate electrode 12 (S202), and the first silicon layer 14 made of an amorphous silicon is formed on the surface of the gate insulating film 13 (S203). Next, as with Embodiment 1, as shown in FIG. 7B, a region of the first silicon layer 14 which includes the first region 141 and is larger than the first region 141 is converted into a polycrystalline silicon by annealing treatment to form a polycrystalline silicon portion 142 (S204).

Next, a photoresist 41 to protect the first region 141 of the first silicon layer 14 is formed by photolithography (S205). FIG. 10A shows a state in which the photoresist 41 has been formed. In the step S205, the photoresist 41 is formed by using a binary photomask. Next, a part of the first silicon layer 14 is removed other than the first region 141, which is protected by the photoresist 41, by wet etching or dry etching (S206). The steps from S205 to S206 correspond to the first etching step. After the etching, the photoresist 41 is removed, and cleaning is carried out. After the etching, as with Embodiment 1, the state shown in FIG. 7E is obtained, in which the remaining first silicon layer 14 is made of a polycrystalline silicon. Next, as with Embodiment 1, as shown in FIG. 7F, the second silicon layer 15 made of an amorphous silicon is formed so as to cover the first silicon layer 14 (S207), and then the n+Si layer 16 is formed (S208).

Next, a photoresist 42 to protect the second region 151 of the second silicon layer 15 and n+Si layer 16 is formed by photolithography (S209). FIG. 10B shows a state in which the photoresist 42 has been formed. The second region 151 of the second silicon layer 15 covers the first silicon layer 14, and an area of a region of the substrate 11 to which the second silicon layer 15 is projected is larger than that of the first silicon layer 14 (first region 141). In the step S209, the photoresist 42 is formed in the same region as the photoresist 41 by using the same photomask used in the step S205. However, by using the different conditions for photolithography in the step S209 and in the step S205, an area of a region of the substrate 11 to which the photoresist 42 is projected is formed to be larger than an area of a region of the substrate 11 to which the photoresist 41 is projected. For example, in the step S205, a smaller photoresist 41 is obtained using over exposure of a positive photoresist and photomask. In the step S209, a larger photoresist 42 is obtained using under exposure of the same photomask as in the step S205.

Next, portions of the second silicon layer 15 and the n+Si layer 16 are removed other than the second region 151, which is protected by the photoresist 42, by wet etching or dry etching (S210). The steps S209 and S210 correspond to the second etching step. After the etching, the photoresist 42 is removed, and cleaning is carried out. After the etching, as with Embodiment 1, the state shown in FIG. 7H is obtained. Next, as with Embodiment 1, patterns of the source electrode 17 and the drain electrode 18 are formed on the n+Si layer 16 by photolithography, and the portions of the n+Si layer 16 and the second silicon layer 15 arranged between the source electrode 17 and the drain electrode 18 are etched by using the formed patterns as a mask, providing the source electrode 17 and the drain electrode 18 shown in FIG. 4 (S211).

It should be noted that in the presently illustrated embodiment, by using the different conditions for the etching, except for the photolithography condition, in the step S210 and in the step S206, an area of a region of the substrate 11 to which the second silicon layer 15 that is left in the step S210 is projected is formed to be larger than an area of a region of the substrate 11 to which the first silicon layer 14 is projected. For example, by using the photoresists of the same size in the step S205 and in the step S209 and using a rather longer etching time in step S206, the region of the first silicon layer 14 to be left can be formed to be smaller than the photoresist, while by using a shorter etching time in the step S210, the region of the second silicon layer 15 to be left can be form to be larger than a remaining region of the first silicon layer 14. This method also enables to from the second silicon layer 15 which has an area after the etching as being larger than the area of the first silicon layer 14 after the etching.

As described above in detail, also in the presently illustrated embodiment, the position of the first silicon layer 14 made of a polycrystalline silicon is determined by the etching but not by the irradiation of the laser beam. This prevents variations in positions of the first silicon layer 14 resulting from the variations in irradiation positions of laser beam and variations in positions of a polycrystalline silicon in a channel layer of a TFT are decreased. Therefore, variations in properties of the TFT such as mobility are decreased. Accordingly, properties of the TFT can be controlled accurately by using the manufacturing method according to the presently illustrated embodiment.

Further, in the presently illustrated embodiment, by controlling the etching conditions such as conditions for photolithography, both the first silicon layer 14 and the second silicon layer 15 having a size larger than the first silicon layer 14 can be formed by using the same photomask. Therefore, as with Embodiment 1, the number of photomasks to be required is not increased, suppressing an increase of a manufacturing cost. Further, using the same photomask enables to use the same alignment mark can be used when forming the photoresist, decreasing variations in positions of the second silicon layer 15 with respect to the first silicon layer 14.

Embodiment 3

In Embodiments 1 and 2, an exemplary embodiment in which the first silicon layer 14 of the TFT is made of a polycrystalline silicon is described. In Embodiment 3, an exemplary embodiment in which the first silicon layer 14 contains an amorphous silicon and a polycrystalline silicon is described.

Figure 11:
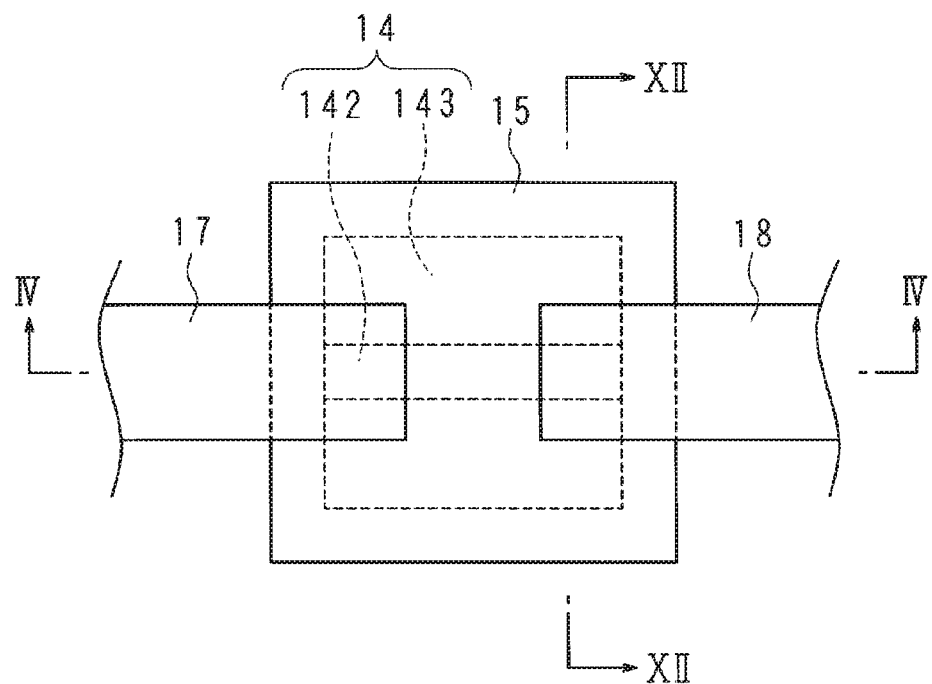
FIG. 11 shows a schematic plan view showing principal parts of a TFT according to Embodiment 3.
Figure 12:
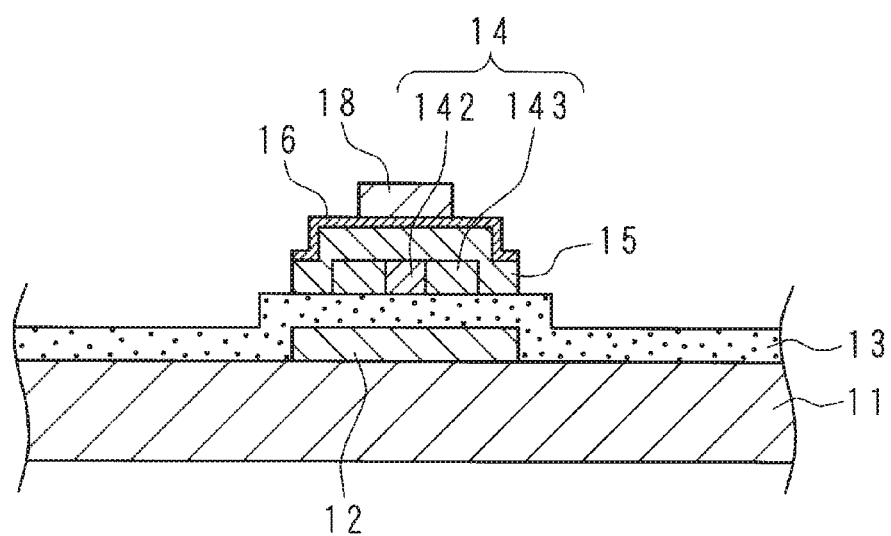
FIG. 12 shows a fragmentary cross-sectional view of a TFT of a XII-XII line of FIG. 11.

FIG. 11 shows a schematic plan view showing principal parts of a TFT according to Embodiment 3. FIG. 12 shows a cross-sectional view of a TFT taken along the XII-XII line of FIG. 11. The cross-sectional view of a TFT taken along the IV-IV line of FIG. 11 is similar to that in Embodiment 1 shown in FIG. 4. As with Embodiments 1 and 2, the TFT includes the substrate 11, the gate electrode 12, the gate insulating film 13, the first silicon layer 14, the second silicon layer 15, the n+Si layer 16, the source electrode 17 and the drain electrode 18. FIG. 11 shows a positional relationship in a plan view of the first silicon layer 14, the second silicon layer 15, the source electrode 17 and the drain electrode 18, in which other structures of the TFT are omitted. The first silicon layer 14 is formed in a rectangular shape in a plan view and covered with the second silicon layer 15. In FIG. 11, the first silicon layer 14 covered with the second silicon layer 15 is shown by a broken line. In this presently illustrated embodiment, the first silicon layer 14 includes a polycrystalline silicon portion 142 and an amorphous silicon portion 143.

As shown in FIG. 11, the polycrystalline silicon portion 142 has the same length as the first silicon layer 14 in a plan view in the direction in which the source electrode 17 and the drain electrode 18 are aligned. Further, a length of the polycrystalline silicon portion 142 is shorter than the first silicon layer 14 in a direction which crosses the direction in which the source electrode 17 and the drain electrode 18 are aligned. A region of the substrate 11 to which the source electrode 17 is projected and a region of the substrate 11 to which a part of the polycrystalline silicon portion 142 is projected overlap each other, and, a region of the substrate 11 to which the drain electrode 18 is projected and a region of the substrate 11 to which a part of the polycrystalline silicon portion 142 is projected overlap each other. The other portion of the first silicon layer 14 is a amorphous silicon portion 143.

Figure 13A:
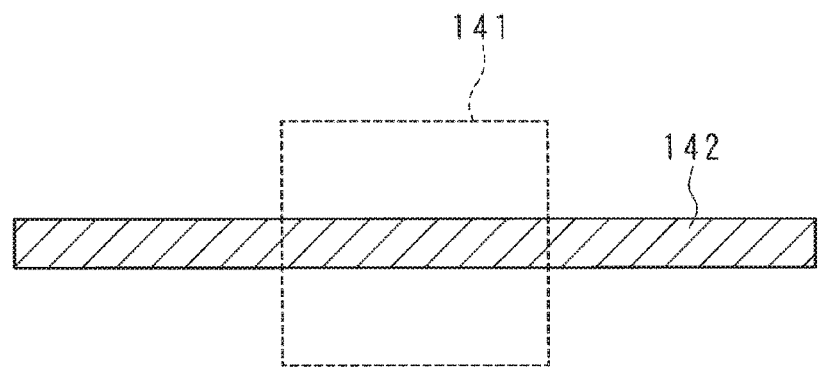
FIG. 13A shows a schematic plan view showing a part of a manufacturing process of a TFT according to Embodiment 3.
Figure 13B:
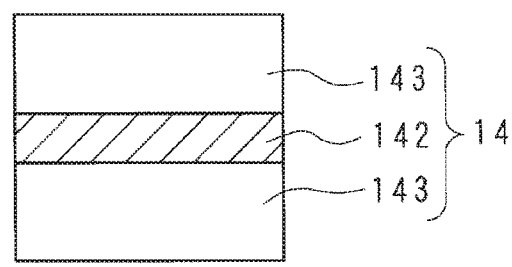
FIG. 13B shows a schematic plan view showing a part of a manufacturing process of a TFT according to Embodiment 3.

The TFT can be manufactured by the similar manufacturing method to the method according to Embodiments 1 and 2. FIG. 13A and FIG. 13B show schematic plan views showing a part of a manufacturing process of a TFT according to Embodiment 3. As with Embodiments 1 and 2, the gate electrode 12 is formed on the substrate 11, the gate insulating film 13 is formed, and the first silicon layer 14 made of an amorphous silicon is formed on the surface of the gate insulating film 13. Next, a part of the first silicon layer 14 is converted into a polycrystalline silicon by annealing treatment. During the annealing treatment, the laser beam is irradiated to a region of the first silicon layer 14 from a part of the first region 141 to the outside of the first region 141. In that case, the laser beam is irradiated to a portion of the first region 141 which is required to form a polycrystalline silicon portion 142, while the laser beam is not irradiated to a portion of the first region 141 which is required to form an amorphous silicon portion 143. In the portion irradiated with the laser beam, the amorphous silicon is converted into the polycrystalline silicon, forming the polycrystalline silicon portion 142. FIG. 13A shows a state in which a part of the first silicon layer 14 has been converted into a polycrystalline silicon. A part within the first region 141 and a part outside the first region 141 form the polycrystalline silicon portion 142, and the polycrystalline silicon portion 142 is formed continuously from the inside to the outside of the first region 141.

Next, the first silicon layer 14 is etched in the manner similar to those described in Embodiments 1 or 2. FIG. 13B shows a state after the etching. On the gate insulating film 13, a portion of the first silicon layer 14 to form a component of the TFT remains. The remaining first silicon layer 14 includes the polycrystalline silicon portion 142 and the amorphous silicon portion 143. The manufacturing process of TFT after the etching process is the same as in Embodiments 1 or 2.

Figure 14:
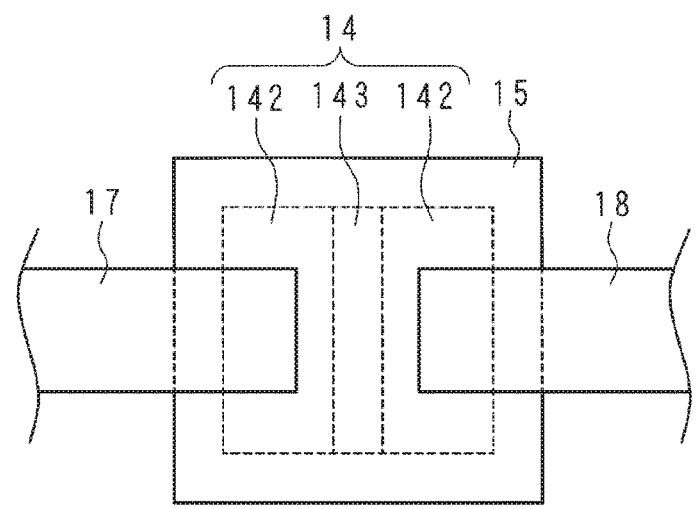
FIG. 14 shows a schematic plan view showing another example of a TFT according to Embodiment 3.

It should be appreciated that the TFT shown in FIG. 11 is merely one example and a position, a shape and a size of the polycrystalline silicon portion 142 in the first silicon layer 14 can be different from those in the example shown in FIG. 11 as far as the first silicon layer 14 includes the polycrystalline silicon portion 142 and the amorphous silicon portion 143. FIG. 14 shows a schematic plan view showing another example of a TFT according to Embodiment 3. FIG. 14 shows a positional relationship in a plan view of the first silicon layer 14, the second silicon layer 15, the source electrode 17 and the drain electrode 18, in which other structures of the TFT are omitted. The amorphous silicon portion 143 has the same length as the first silicon layer 14 in a plan view in the direction which crosses the direction in which the source electrode 17 and the drain electrode 18 are aligned. The length of the amorphous silicon portion 143 is shorter than the first silicon layer 14 in the direction in which the source electrode 17 and the drain electrode 18 are aligned. Further, a region of the substrate 11 to which the source electrode 17 and the drain electrode 18 is projected and a region of the substrate 11 to which the amorphous silicon polycrystalline 143 is projected do not overlap with each other. Other part of the first silicon layer 14 forms the polycrystalline silicon portion 142. Therefore, the polycrystalline silicon portion 142 is separated by the amorphous silicon portion 143 disposed between the source electrode 17 and the drain electrode 18. A region of the substrate 11 to which the source electrode 17 and the drain electrode 18 is projected and a region of the substrate 11 to which a part of the polycrystalline silicon portion 142 is projected overlap each other.

Figure 15A:
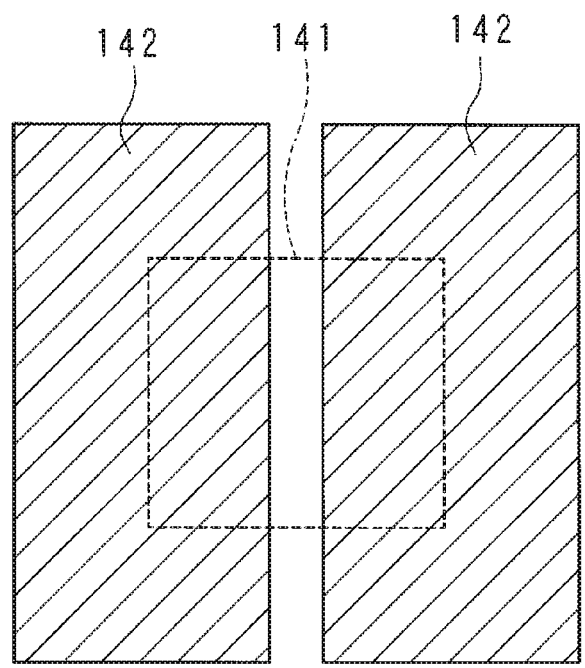
FIG. 15A shows a schematic plan view showing another example of a manufacturing process of a TFT according to Embodiment 3.
Figure 15B:
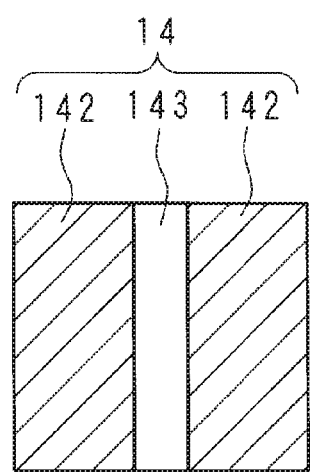
FIG. 15B shows a schematic plan view showing another example of a manufacturing process of a TFT according to Embodiment 3.

FIG. 15A and FIG. 15B show schematic plan views showing a part of manufacturing process of another example of TFT according to Embodiment 3. FIG. 15A shows a state in which a part of the first silicon layer 14 has been converted into a polycrystalline silicon by annealing treatment. A part of inside the first region 141 and a part of outside the first region 141 forms the polycrystalline silicon portion 142, and the polycrystalline silicon portion 142 is formed continuously from the inside to the outside of the first region 141. FIG. 15B shows the first silicon layer 14 after the etching. The first silicon layer 14 after the etching includes the polycrystalline silicon portion 142 and the amorphous silicon portion 143. Finally, the TFT shown in FIG. 14 is manufactured.

As described above in detail, in the presently illustrated embodiment, the first silicon layer 14 which is included in the channel layer of the TFT includes the polycrystalline silicon portion 142 and the amorphous silicon portion 143. Converting a part of the first silicon layer 14 into the polycrystalline silicon portion 142 enables to control the properties of the TFT such as mobility more finely as compared with the case where the entire first silicon layer 14 is converted into the polycrystalline silicon. In the presently illustrated embodiment, the position of the first silicon layer 14 is determined by the etching but not by the irradiation of the laser beam, so that the position of the polycrystalline silicon portion 142 is also determined by the etching. This prevents variations in positions of the polycrystalline silicon portion 142 resulting from the variations in irradiation positions of laser beam and variations in positions of a polycrystalline silicon in a channel layer of a TFT are decreased. Thus, variations in areas and shapes of a portion where a region of the substrate 11 to which the polycrystalline silicon portion 142 in the channel layer is projected and a region of the substrate 11 to which the source electrode 17 and the drain electrode 18 is respectively projected overlap each other are decreased, decreasing variations in properties of the TFT such as mobility. Properties of the TFT can be controlled accurately by using the manufacturing method according to the presently illustrated embodiment.

It should be noted that in the presently illustrated embodiment, an exemplary embodiment is described in which a region of the substrate 11 to which the polycrystalline silicon portion 142 is projected and a region of the substrate 11 to which the source electrode 17 and the drain electrode 18 is respectively projected overlap each other, however, the TFT may be formed such that a region of the substrate 11 to which the polycrystalline silicon portion 142 is projected and a region of the substrate 11 to which the source electrode 17 and the drain electrode 18 is respectively projected do not overlap each other. Further, the TFT may be formed such that a region of the substrate 11 to which the one of the source electrode 17 and the drain electrode 18 is projected and a region of the substrate 11 to which the polycrystalline silicon portion 142 is projected overlap each other, while a region of the substrate 11 to which the other of the source electrode 17 and the drain electrode 18 is projected and a region of the substrate 11 to which the polycrystalline silicon portion 142 is projected do not overlap each other. Furthermore, in the above-mentioned Embodiments 1 to 3, the exemplary example in which the laser beam is used in the annealing treatment is described, however, in the present disclosure, an energy beam other than the laser beam may be used in the annealing treatment.

In the present disclosure, the TFT (thin film transistor) includes the first silicon layer and the second silicon layer. In the method of manufacturing the TFT according to the present disclosure, the first silicon layer made of an amorphous silicon is formed, an energy beam irradiates on a region of the first silicon layer from a part or the whole of a predetermined region to form a component of the TFT in the first silicon layer to an outside of the predetermined region, and a portion of the first silicon layer irradiated with the energy beam is converted into a polycrystalline silicon. Further, the first silicon layer is etched while leaving the predetermined region, and a second silicon layer made of an amorphous silicon is formed in a region larger than the predetermined region of the first silicon layer so as to cover the predetermined region of the first silicon layer. The first silicon layer and the second silicon layer after being etched serve as a channel layer of the TFT. A position of the polycrystalline silicon portion in the channel layer affects on the properties of the TFT such as mobility. A part of the polycrystalline silicon portion in the first silicon layer, which is generated by the irradiation of the energy beam is removed other than the necessary portion by the etching, and therefore, the position of the polycrystalline silicon is determined by the etching, not by the irradiation of the energy beam. This prevents variations in positions of the polycrystalline silicon resulting from the variations in irradiation positions of energy beam, and decreases variations in positions of the polycrystalline silicon in the channel layer of the TFT.

Further, in the present disclosure, a region of a substrate to which a polycrystalline silicon portion in the first silicon layer is projected and a region of a substrate to which at least one of the source electrode and the drain electrode are projected overlap each other. Variations in areas and shapes of a portion where a region of a substrate to which the polycrystalline silicon portion is projected and a region of a substrate to which the source electrode and the drain electrode are respectively projected overlap each other, which affect on the properties of the TFT, are decreased.

Further, in the present disclosure, when forming a first photoresist for the etching of the first silicon layer, a photoresist having a partially thin portion is formed by using a multi-gradation photomask, and then a thin portion of the photoresist is removed. When forming a second photoresist for the etching of the second silicon layer, the same photomask as used for forming the first photoresist for the etching of the first silicon layer is used to form a second photoresist, while a thin portion is not removed. The first photoresist for protecting the predetermined region of the first silicon layer and the second photoresist for protecting the region of the second silicon layer, which is larger than the first silicon layer, can be formed by using the same photomask.

In the present disclosure, by adjusting the etching conditions such as light exposure amount in the photolithography during the etching process of the first silicon layer and the etching process of the second silicon layer, the first silicon layer and the second silicon layer having a size larger than that of the first silicon layer can be formed. This enables to form the first silicon layer and the second silicon layer by using the same photomask, even when a binary photomask is used.

What is claimed is:

1. A method of manufacturing a thin film transistor comprising:
    forming a gate electrode on a surface of a substrate,
    forming an insulating film on the surface of the substrate on which the gate electrode is formed, forming a first silicon layer comprising an amorphous silicon after formation of the insulating film, irradiating a region of the first silicon layer from a part or the whole of a predetermined region of the first silicon layer to an outside of the predetermined region with an energy beam so as to convert a portion of the first silicon layer irradiated with the energy beam into a polycrystalline silicon, a first etching step for etching the first silicon layer while leaving the predetermined region, forming a second silicon layer comprising an amorphous silicon in a region larger than the predetermined region of the first silicon layer so as to cover the predetermined region of the first silicon layer, a second etching step for etching the second silicon layer covering the predetermined region of the first silicon layer while leaving a part of the second silicon layer, the part larger than the predetermined region of the first silicon layer, and forming a source electrode and a drain electrode such that the first silicon layer and the second silicon layer after being etched serve as channel layers.

2. The method of manufacturing a thin film transistor of claim 1, wherein the source electrode and the drain electrode are formed in such a way that a region of a substrate to which a polycrystalline silicon portion in the first silicon layer is projected and a region of the substrate to which at least one of the source electrode and the drain electrode are projected overlap each other.

3. The method of manufacturing a thin film transistor of claim 1, wherein the first etching step comprises:

forming a first photoresist to protect the predetermined region of the first silicon layer and a part of the first silicon layer adjacent to the predetermined region using a multi-gradation photomask, wherein a thickness of a portion of the first photoresist to protect the part adjacent to the predetermined region is thinner than a thickness of a portion of the first photoresist to protect the predetermined region, removing the portion of the first photoresist to protect the part adjacent to the predetermined region by an ashing, and removing a portion of the first silicon layer not protected by a remaining portion of the first photoresist, and the second etching step comprises:

forming a second photoresist to protect a portion of the second silicon layer covering the predetermined region of the first silicon layer and a part of the second silicon layer adjacent thereto by using the same photomask as used in the first etching step, and removing a portion of the second silicon layer not protected by the second photoresist.

4. The method of manufacturing a thin film transistor of claim 1, wherein the first etching step and the second etching step comprise forming a respective photoresist by using the same photomask in the first etching step and the second etching step, and different etching conditions are used in the first etching step and the second etching step such that an area of the second silicon layer after the second etching is larger than an area of the first silicon layer after the first etching step.

* * * * *